United States Patent [19]

Skalka et al.

[11] Patent Number: 5,225,794
[45] Date of Patent: Jul. 6, 1993

[54] METHOD AND APPARATUS FOR A SWEEP OSCILLATOR

[75] Inventors: Robert J. Skalka, Tempe, Ariz.;
Mark J. Brown, Englewood, Colo.;
Karl C. Stambaugh, Scottsdale, Ariz.

[73] Assignee: Motorola, Inc., Schaumburg, Ill.

[21] Appl. No.: 793,890

[22] Filed: Nov. 18, 1991

[51] Int. Cl.⁵ ............................ H03B 23/00; H03L 7/08
[52] U.S. Cl. ........................................ 331/178; 331/4; 331/17; 331/74
[58] Field of Search .................... 331/4, 18, 25, 178, 331/17, 20, 74

[56] References Cited

U.S. PATENT DOCUMENTS

| | | |
|---|---|---|
| 4,001,726 | 1/1977 | Sanford, Jr. et al. ............ 331/178 |
| 4,130,808 | 12/1978 | Marzalek ............................ 331/4 X |
| 4,316,154 | 2/1982 | Krause ................................. 331/4 |

Primary Examiner—David Mis
Attorney, Agent, or Firm—Frederick M. Fliegel

[57] ABSTRACT

A method and apparatus for a sweep oscillator and a spectrum analyzer containing the sweep oscillator having a precisely determined center frequency includes a sweep circuit having a sawtooth waveform, a reference oscillator, a microprocessor controller and a modified phase-locked loop. The modified phase-locked loop further includes a control signal summer, a voltage controlled oscillator coupled to the control signal summer, a sweep oscillator output, and a sample and hold circuit including a switching circuit.

16 Claims, 3 Drawing Sheets

METHOD AND APPARATUS FOR A SWEEP OSCILLATOR

FIELD OF THE INVENTION

The present invention concerns an improved means and method for sweep oscillators and, more particularly, for realizing sweep oscillators having stable center frequencies determined by phase-locked loop circuits.

BACKGROUND OF THE INVENTION

Conventional swept frequency sources, or sweep oscillators, often lack the frequency stability and accuracy associated with high stability, fixed frequency oscillators. When swept frequency sources are employed in spectrum analyzers, these frequency imprecisions can lead to visible drift and frequency position errors of the displayed spectrum. This drift, in turn, can lead to inaccurate data collection or may delay collection of accurate data while the oscillator frequency is recalibrated to enable an accurate spectral measurement.

Phase-locked loops are often used as programmable frequency sources where both programmability and stability are required. Phase-locked loops operate by including a voltage-controlled oscillator (VCO), a programmable frequency divider, a phase detector, and a loop filter, connected to form a loop.

Also required is an external fixed-frequency oscillator, connected to the phase detector such that a signal derived from the VCO is phase-locked to the external fixed-frequency oscillator, as is well known in the art. This type of arrangement provides, via the phase-locking mechanism, the stability of the fixed-frequency oscillator while allowing VCO frequency programmability via alteration of the signal derivation process. However, such circuits require a certain amount of time, referred to as the "settling time", in order to accommodate VCO frequency changes. This arises because overall "loop" implementing a small frequency step typically has a fairly narrow bandwidth and so has a relatively long impulse response. When a change is introduced into the loop, for example to change the VCO frequency, the loop impulse response time determines the overall time required for the phase-locked loop to settle to the altered frequency.

What is needed is a simple means for providing a swept frequency source having stability characteristics similar to those associated with phase-locked loop frequency sources but having rapid settling times.

Accordingly, one advantage of the present invention is to provide a stable sweep oscillator incorporating the cost and performance advantages of phase-locked loops and having sweep rates which are independent of the phase-locked loop bandwidth.

SUMMARY OF THE INVENTION

According to the present invention, a novel method and apparatus for achieving high frequency stability sweep oscillator circuits employing phase-locked loop circuits are described.

A method for providing a sweep oscillator comprising a modified phase-locked loop and a sample and hold circuit containing a switch, wherein the sweep oscillator has a precisely determined center frequency, includes the steps of opening the switch to open the modified phase-locked loop, initiating a sweeping waveform, and combining low frequency control signals including the sweeping waveform to form a master control signal. The master control signal is applied to a voltage controlled oscillator and sweeps through a range of sweep voltages, causing the voltage controlled oscillator to sweep through a corresponding range of frequencies. Closing the switch closes the modified phase-locked loop, and after waiting a predetermined time for the modified phase-locked loop to stabilize and lock to the center frequency, the foregoing steps are repeated.

The method desirably but not essentially includes the steps of controlling a sweep generating circuit, a programmable frequency divider, and an offset voltage circuit by means of a microprocessor controller.

A sweep oscillator having a precisely determined center frequency comprises a sweep circuit having a sawtooth waveform, a reference oscillator, a microprocessor controller and a modified phase-locked loop. The modified phase-locked loop further comprises control signal summing means, a voltage controlled oscillator coupled to the control signal summing means, a sweep oscillator output, and a sample and hold circuit including a switching circuit.

A spectrum analyzer having a precisely determined center frequency desirably comprises a display for displaying an amplitude of an input signal versus frequency and a sweep circuit for providing a sweep voltage having a time varying waveform. The spectrum analyzer further desirably comprises a reference oscillator for providing a reference frequency signal and a phase-locked loop for providing a frequency swept signal having a precisely determined center frequency. The phase-locked loop further desirably includes a switching circuit for opening and closing a loop of the phase locked loop to couple and uncouple the loop to the reference oscillator.

The above and other features and advantages of the present invention will be better understood from the following detailed description taken in conjunction with the accompanying drawings.

DETAILED DESCRIPTION OF THE DRAWING

Figure 1:
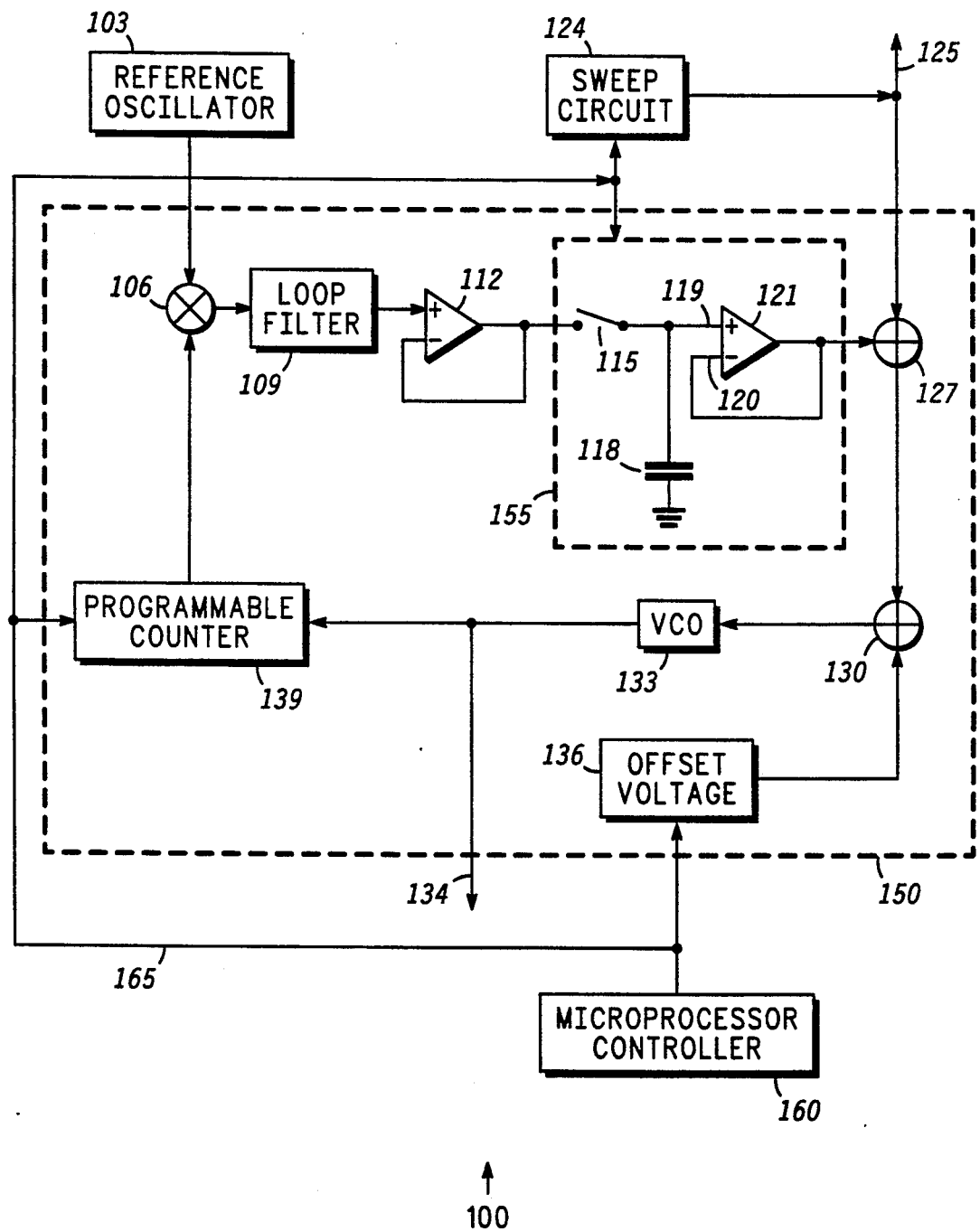
FIG. 1 schematically illustrates a sweep oscillator in accordance with the present invention.

FIG. 1 schematically illustrates sweep oscillator 100 in accordance with the present invention. Circuit 100 comprises reference oscillator 103, sweep circuit 124 having sweep voltage output 125, microprocessor controller 160 and bus 165, and modified phase-locked loop 150 having output 134. Modified phase-locked loop 150 comprises phase detector 106, loop filter 109, operational amplifier 112, sample and hold circuit 155, first voltage summing circuit 127, second voltage summing circuit 130, offset voltage source 136, voltage controlled oscillator 133, output 134, and programmable frequency divider circuit or counter 139. Programmable frequency divider circuit or counter 139, phase detector 106, loop filter 109, and operational amplifier 112 collectively operate as a signal combining circuit for combining two signals to provide a control signal. Sample and hold circuit 155 comprises switching circuit 115, capacitor 118 and operational amplifier 121. Phase detector 106 can be implemented in a number of ways known in the art. One method for realizing phase detector 106 is to employ a mixer circuit having a response which includes an ability to provide a direct current output signal.

In FIG. 1, microprocessor controller 160 is shown as being coupled to programmable frequency divider 139, sweep circuit 124, sample and hold circuit 155, and offset voltage circuit 136 by means of bus 165, allowing microprocessor controller 160 to coordinate instructions to relevant portions of sweep oscillator 100. Modified phase-locked loop 150 comprises voltage controlled oscillator 133 coupled to programmable frequency divider or counter 139, which provides to phase detector 106 a signal of reduced frequency equal to the frequency from voltage controlled oscillator 133 divided by N, which is determined by microprocessor controller 160. Phase detector 106 is coupled to programmable frequency divider or counter 139 and to reference oscillator 103. Phase detector 106 provides to loop filter 109 a signal proportional to the difference in phase between the signal from programmable counter or counter 19 and the signal from reference oscillator 103. Loop filter 109 is coupled to operational amplifier 112, which acts as a unity gain buffer amplifier. Programmable frequency divider circuit or counter 139, phase detector 106, loop filter 109, and operational amplifier 112 collectively operate as a signal combining circuit for combining two signals to provide a control signal. Operational amplifier 112 is coupled to sample and hold circuit 155, which is further coupled via voltage summing circuits 127, 130 to voltage controlled oscillator 133. Voltage summing circuit 127 is further coupled to sweep circuit 124 while voltage summing circuit 130 is coupled to voltage summing circuit 127, offset voltage source 136, and voltage controlled oscillator 133.

Figure 2:
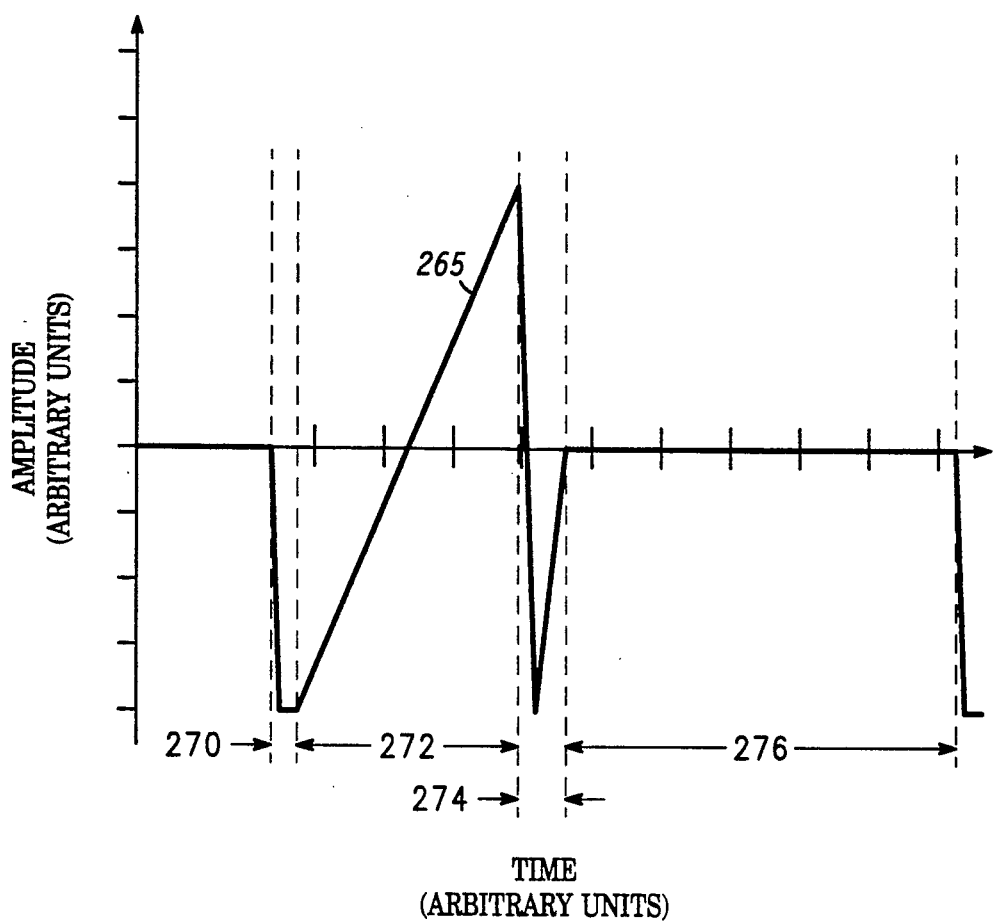
FIG. 2 graphically depicts a sawtooth waveform in accordance with the present invention.

FIG. 2 graphically depicts sawtooth waveform 265 in accordance with the present invention. One period of waveform 265 comprises times represented as sweep initiation component 270, sweep time 272, sweep reset period 274, and idle interval 276 during which waveform 265 is zero, following which sweep initiation 270 and the other waveform components repeat. The integral of waveform 265 over the sum of intervals 270, 272 and 274 is zero, providing an average direct current value of waveform 265 of zero volts.

Referring to FIGS. 1 and 2, the operation of circuit 100 can be understood by initially assuming that sweep circuit 124 and offset voltage source 136 are both producing steady output signals of zero volts, and by assuming that switching circuit 115 is "closed", or connecting the output of operational amplifier 112 to lead 119 of operational amplifier 121. This position of switch 115 corresponds to a "closed loop" condition for modified phase-locked loop 150.

Operational amplifier 121 is configured to provide unity gain by connection of the output port to lead 120 in FIG. 1. This arrangement provides extremely high input impedance and low output impedance, as is well known in the art, and so provides substantial buffering of the element connected to lead 119 from circuit effects occurring at the amplifier output, and is called a voltage follower. Operational amplifier 112 is similarly connected to provide a similar buffering function.

In the closed loop condition, reference oscillator 103 provides a signal which is mixed by phase detector 106 with a signal from programmable frequency divider 139 to derive an error signal. This error signal is filtered by loop filter 109 and is buffered by operational amplifier 112. The buffered error signal magnitude is held by sample and hold 155, transmitted with unity gain, and applied to VCO 133. VCO 133 changes frequency in response to this buffered error signal, changing the frequency of the signal input to programmable frequency divider or counter 139 in such a way as to cause modified phase-locked loop 150 to converge to a stable frequency of oscillation. Output 134 provides this output signal to external apparatus (not shown in FIG. 1).

When switch 115 is "opened", as shown in FIG. 1, the feedback process providing stability of loop operation is interrupted. Sample and hold circuit 155 maintains the voltage impressed on the non-inverting input of operational amplifier 121, maintaining the oscillation frequency of VCO 133 and so continuing to provide stable operation of loop 150 and a stable output frequency on output 134 at the center frequency.

Sweep circuit 124 is then allowed to produce sawtooth waveform 265 (FIG. 2) which is added to the output of sample and hold 155 by first voltage summing circuit 127, causing the frequencies of VCO 133 and output 134 to sweep from a low frequency to a higher frequency in synchronization with sawtooth waveform 265 produced by sweep circuit 124. Modified phase-locked loop 150 thus produces swept frequency output signals in synchronization with the signal of sweep circuit output 125.

A further signal is provided by offset voltage source 136, which is added to the voltage from voltage summing circuit 127 by voltage summing circuit 130. When the voltage from offset voltage source 136 is set to determine the average frequency of VCO 133, the loop is locked to the center frequency. Voltage source 136 is adjusted to obtain a near zero voltage on capacitor 118 of sample and hold 155. This adjustment does not change the frequency of VCO 133, as this frequency is maintained at the center frequency. The voltage maintained by capacitor 118 of sample and hold 155 is thus small, causing the changes in this voltage to be small versus time. This in turn minimizes drift of the phase-locked loop center frequency due to changes in the voltage stored on capacitor 118, caused by current leakage within capacitor 118 or by ancillary circuitry within sample and hold 155. Switch 115 is closed during idle interval 276, when the output of sweep circuit 124 is zero volts, allowing modified phase-locked loop 150 to stabilize in accordance with the conditions described for closed loop operation, supra.

Switch 115 is open during sweep 265, allowing the frequency of VCO 133 to vary in accordance with sweep 265 without perturbation of the voltage maintained by sample and hold 155. Switch 115 is closed following sweep reset interval 274 and during the early portion (left side) of idle interval 276, allowing the loop to re-establish equilibrium during idle interval 276. Switch 115 is opened again near the conclusion (right side) of idle interval 276, allowing VCO 133 to respond to the stabilized output of sample and hold 155. Sweep circuit 124 thus provides a non-zero signal to VCO 133 of modified phase-locked loop 150 only when the loop is open, avoiding the possibility that the loop error voltage might change or distort the sweeping of VCO 133 by the sweep voltage.

Figure 3:
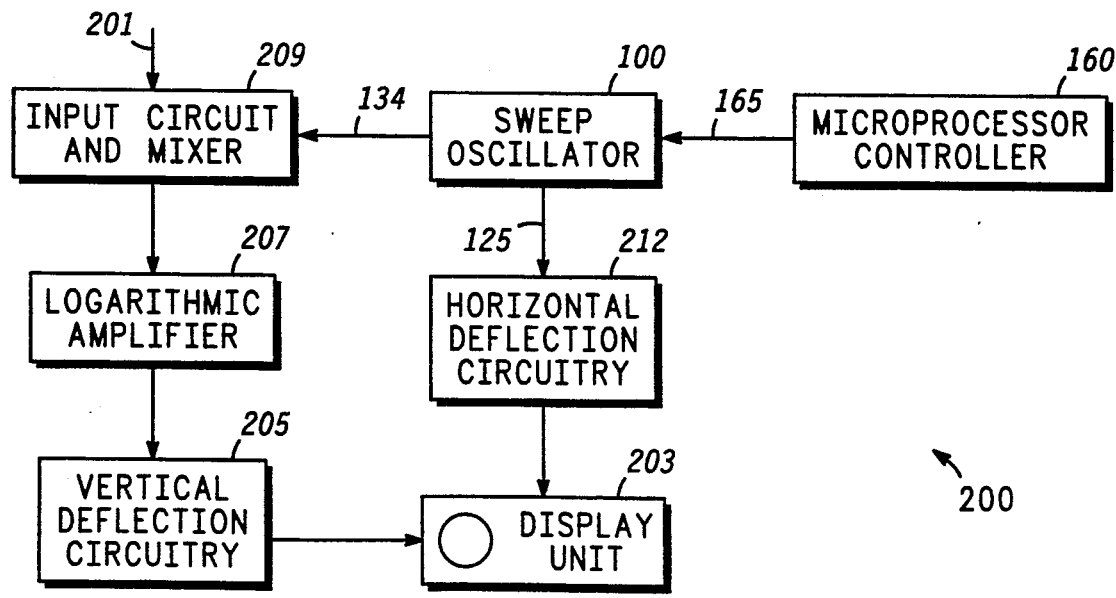
FIG. 3 is a simplified schematic illustration of a spectrum analyzer in accordance with the present invention.

FIG. 3 is a simplified schematic illustration of spectrum analyzer 200 in accordance with the present invention. Spectrum analyzer 200 comprises display unit 203 coupled to vertical deflection circuitry 205 and horizontal deflection circuitry 212, optional logarithmic amplifier 207 coupled to vertical deflection circuitry 205 and to input circuit and mixer 209 having input 201. Sweep oscillator 100 having outputs 125 and 134 is coupled to input circuit and mixer 209, horizontal deflection circuitry 212, and to microprocessor 160 via bus 165.

In operation, an input signal is provided at input 201. The component of this input signal which is at the instantaneous frequency given by the difference between the frequency of sweep oscillator 100 and the frequency at which input circuitry of 209 operates is amplified and transmitted to logarithmic amplifier 207. As the frequency of sweep oscillator 100 passes through the desired range, all components of the input signal at input 201 in that frequency range are transmitted to logarithmic amplifier 207. Simultaneously, sweep signal 265 (FIG. 2) is generated on output 125 of sweep oscillator 100, whose voltage is proportional to the frequency of sweep oscillator 100, normalized to the range of frequencies over which sweep oscillator 100 is sweeping. Horizontal deflection circuitry 212 thus causes display unit 203 to display a signal whose position along the horizontal axis is directly related to the frequency of sweep oscillator 100 at any instant in time, while vertical deflection circuitry 205 provides a signal whose amplitude is directly related to the magnitude of the input signal at a frequency determined by sweep oscillator 100 at that time. Display unit 203 thus graphs the input signal magnitude versus frequency.

Figure 4:
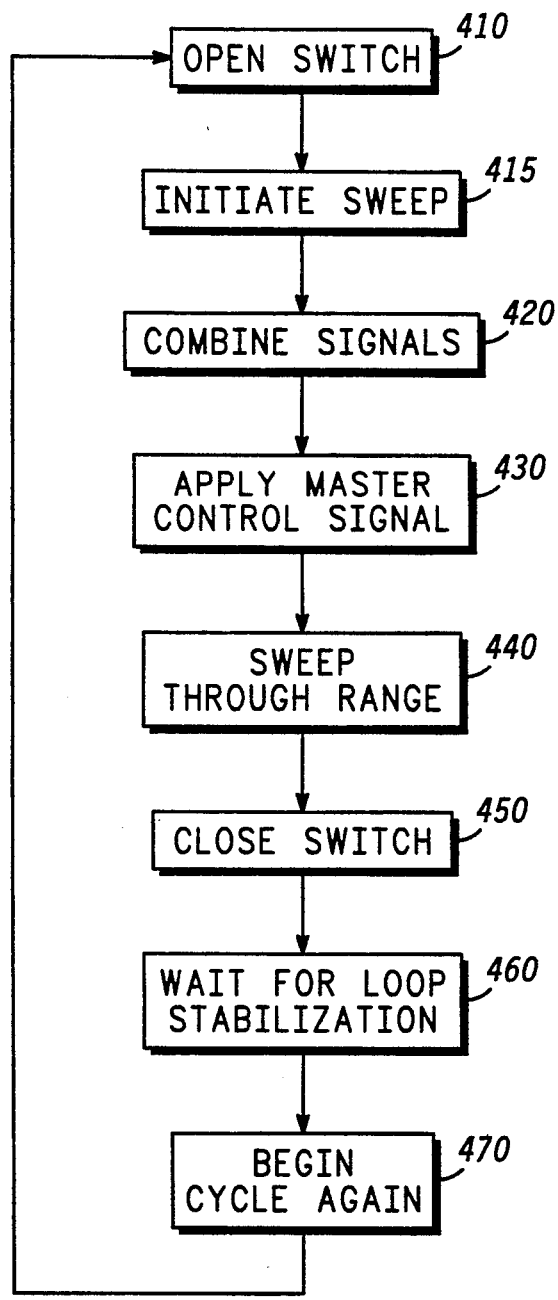
FIG. 4 is a flow diagram illustrating a method for sweeping a phase-locked loop oscillation frequency in accordance with the present invention.

FIG. 4 is a flow diagram illustrating method 400 for sweeping a phase-locked loop oscillation frequency in accordance with the present invention. Method 400 comprises the steps of opening 410 switch 115 to open the modified phase-locked loop 150 and then initiating 415 a sweeping waveform. This is followed by the step of combining 420 low frequency control signals including the sweeping waveform to form a master control signal and then applying 430 the master control signal to a voltage controlled oscillator. Subsequently the step of sweeping 440 the sweeping waveform through a range of sweep voltages causes the voltage controlled oscillator to sweep through a corresponding range of frequencies in response to the master control signal. The steps of closing 450 the switch to close the modified phase-locked loop, waiting 460 a predetermined time for the modified phase-locked loop to stabilize, and repeating 470 the steps of opening 410, initiating 415, combining 420, applying 430, sweeping 440, closing 450, waiting 460, and repeating 470 cause the sweep cycle to complete and then to repeat.

Based on the foregoing description, it will be apparent to those of skill in the art that the present invention solves the problems and achieves the goals set forth earlier, and has substantial advantages as pointed out herein, namely, providing accurate and stable determination of the sweep oscillator center frequency equivalent to the stability of phase-locked frequency sources. A further advantage is that the invention also permits arbitrary sweep rates to be achieved by a phase-locked loop oscillator, independent of the loop bandwidth of the oscillator. A still further advantage of the present invention comprises minimization of center frequency drift by minimization of the voltage stored on the capacitor of the sample and hold circuitry incorporated in the phase-locked loop.

While the present invention has been described in terms of particular arrangements, elements, structures and steps, these choices are for convenience of explanation and not intended to be limiting and, as those of skill in the art will understand based on the description herein, the present invention applies to other choices of arrangements, elements, structures and steps, and it is intended to include in the claims that follow, these and other variations as will occur to those of skill in the art based on the present disclosure.

What is claimed is:

1. A method for providing a swept frequency signal having a precisely determined center frequency by operating an electronic apparatus comprising a microprocessor controller, a phase-locked loop including a reference oscillator input and a sample and hold circuit including a switch and an input, the phase locked loop providing a low frequency loop error signal at a first output, the method including the steps of:

opening the switch to open the phase-locked loop;
combining low frequency control signals including the low frequency loop error signal to form a master control signal;
sweeping a sweep waveform to cause a voltage controlled oscillator to sweep through a corresponding range of frequencies in response to the master control signal;
wherein said combining step includes steps of:
generating an offset voltage signal in response to commands from a microprocessor controller, the offset voltage signal having a magnitude such that the low frequency loop error signal has a value approaching zero volts; and
providing the low frequency loop error signal to the sample and hold circuit input, the sample and hold circuit holding the low frequency loop error signal; and
closing the switch to close the phase-locked loop to lock the phase-locked loop.

2. The method as claimed in claim 1, wherein there is further included a step of controlling by a microprocessor controller said steps of opening and closing.

3. The method as claimed in claim 2, wherein there is further included a step of repeating by the microprocessor controller said steps of opening, combining, sweeping, closing and controlling.

4. The method as claimed in claim 3, wherein said opening step includes a step of initiating the sweep waveform.

5. The method as claimed in claim 4, wherein said combining step includes a step of combining the sweep waveform with the low frequency loop error signal to form the master control signal.

6. The method as claimed in claim 5, wherein said step of combining the low frequency loop error signal with the sweep waveform further includes steps of:
combining a stored signal from the sample and hold circuit to form the master control signal; and
applying the master control signal to the voltage controlled oscillator.

7. The method as claimed in claim 6, wherein there is further included a step of waiting a predetermined time for the phase-locked loop to stabilize.

8. The method as claimed in claim 7, wherein said repeating step includes said steps of initiating, combining the sweep waveform, applying and waiting.

9. The method as claimed in claim 1, wherein said generating step is performed in response to commands from a microprocessor controller.

10. An electronic apparatus having a precisely determined center frequency exhibiting reduced frequency drift versus time, said electronic apparatus comprising:

sweep circuit means for providing a time varying sweep voltage;

reference oscillator means for providing a precisely determined reference frequency signal;

microprocessor controller means for providing control signals; and phase-locked loop means for providing a swept frequency signal having a predetermined relationship to said precisely determined reference frequency signal, said phase-locked loop means coupled to said sweep circuit means and to said reference oscillator means, said phase-locked loop means further comprising switch means for temporarily interrupting a portion of said phase-locked loop means, said phase-locked loop means comprising:

sample and hold means incorporating said switch means and coupled to said microprocessor controller means and to said sweep circuit means, said sample and hold means for holding a first volume sampled by said switch means, said sample and hold means having an input for accepting said first voltage and an output for providing a held voltage, said sample and hold means including:

holding means coupled to said switch means, said holding means for holding said first voltage and having an output for providing said held voltage; and first voltage summing circuit means having a first input coupled to an output of said holding means and a second input coupled to an output of said sweep circuit means, said first voltage summing circuit means for summing said held voltage with said time varying sweep voltage, wherein said time varying sweep voltage has, in part, a sawtooth waveform;

said electronic apparatus further comprising:

offset voltage generating means coupled to said microprocessor means, said offset voltage generating means for providing an offset voltage at a first output in response to commands from said microprocessor means;

second voltage summing circuit means having a first input coupled to an output of said first voltage summing circuit means, a second input coupled to said output of said offset voltage generating means and an output coupled to said phase locked loop means, said second voltage summing circuit means for summing said offset voltage with a signal from said output of said first voltage summing circuit means to provide a control voltage, wherein said offset voltage generating means, said microprocessor controller means, and said holding means cooperate so as to maintain said first voltage at about zero volts and thereby reduce drift of said held voltage versus time; and voltage controlled oscillator means having an input coupled to said output of said second voltage summing circuit means, said voltage controlled oscillator means for generating said swept frequency signal in response to said control voltage.

11. The electronic apparatus as claimed in claim 10, wherein said phase-locked loop means further comprises:

combining means having a first input coupled to said sample and hold means incorporating said switch means, a second input coupled to an output of said reference oscillator means and a third input coupled to an output of said voltage controlled oscillator means, said combining means having an output coupled to said sample and hold means to form a loop, said combining means for combining said precisely determined reference frequency signal from said reference oscillator means with said swept frequency signal to provide a control signal for controlling a frequency of said voltage controlled oscillator means, wherein said switch means opens and closes said loop to couple and uncouple said loop to said reference oscillator means.

12. The electronic apparatus as claimed in claim 11, wherein said combining means includes:

programmable counter means operating in response to commands from said microprocessor controller, said programmable counter means having an input coupled to said voltage controlled oscillator means, said programmable counter means for frequency dividing said swept frequency signal from said voltage controlled oscillator means to provide a low frequency signal at an output of said programmable counter means;

phase detector means having a first input coupled to said output of said programmable counter means and having a second input coupled to an output of said reference oscillator means, said phase detector means for mixing said precisely determined reference frequency signal from said reference oscillator means with said low frequency signal from said output of said voltage controlled oscillator means to provide an error signal at an output of said phase detector means;

loop filter means having an input coupled to said output of said phase detector means, said loop filter means for filtering said error signal from said output of said phase detector means to provide a filtered error signal at an output of said loop filter means; and voltage follower means having an input coupled to said output of said loop filter means, said voltage follower means for buffering said filtered error signal from said loop filter means to provide said first voltage at an output of said voltage follower means.

13. The electronic apparatus as claimed in claim 12, wherein said microprocessor controller means is coupled to and coordinates said offset voltage generating means, said programmable counter means to provide said first voltage of about zero volts at said input of said sample and hold means.

14. An electronic apparatus having a precisely determined center frequency comprising:

sweep circuit means for providing a sweep voltage having a time varying waveform;

reference oscillator means having a reference output, said reference oscillator means for providing a reference frequency signal;

phase-locked loop means coupled to said sweep circuit means, said phase locked loop means for providing a frequency swept signal having a precisely determined center frequency, said phase-locked loop means including switching circuit means for opening and closing a loop of said phase locked loop means to couple and uncouple said loop to said reference oscillator means;

microprocessor controller means for providing control signals;

sample and hold means having an analog input and an analog output, said sample and hold means having a digital input coupled to said microprocessor controller means, said analog output coupled to an output of said sweep circuit means, said sample and hold means for holding a sample of a first signal present at said analog input and providing a held voltage at said analog output in response to control signal from said microprocessor controller means;

first voltage summing circuit means having a first input coupled to said analog output and a second input coupled to an output of said sweep circuit means, said first voltage summing circuit means for summing said held voltage with said sweep voltage, wherein said sweep voltage has, in part, a sawtooth waveform;

offset voltage generating means coupled to said microprocessor means, said offset voltage generating means for providing an offset voltage at a first output in response to commands from said microprocessor means;

wherein said microprocessor controller means and said offset voltage generating means cooperate so as to maintain said first signal at about zero volts;

voltage controlled oscillator means having an input coupled to said analog output of said sample an hold means, to said output of said sweep circuit means and to said output of said first output of said offset voltage generating means, said voltage controlled oscillator means for generating a swept frequency output signal at an output of said voltage controlled oscillator means; and combining means coupled to said analog input and to said output of said voltage controlled oscillator means to form a loop, said combining means having an input coupled to said reference output, said combining means for combining said reference frequency signal with said swept frequency signal to provide a control signal for controlling said voltage controlled oscillator means.

15. An electronic apparatus as claimed in claim 14, further including:

a signal input for providing an input signal;

display means having a first input coupled to said control signal and a second input coupled to said signal input, said display means for displaying said input signal, said display means including:

vertical deflection circuitry means for providing vertical display drive signals in response to an input signal, said vertical deflection circuitry means having an output coupled to said display means;

horizontal deflection circuitry means for providing horizontal display drive signals, said horizontal deflection circuitry means having an input coupled to said sweep circuit means; and input circuit means for conditioning said input signal, said input circuit means having an input coupled to said signal input, said input circuit means having an output coupled to said vertical deflection circuitry means.

16. The electronic apparatus as claimed in claim 15, wherein said display means further includes logarithmic amplifier means having an output coupled to said input of said vertical deflection circuitry means and having an input coupled to said signal input, said logarithmic amplifier means for providing logarithmically varying voltages to said vertical deflection circuitry means in response to said input signal.

* * * * *